(12) United States Patent
Kim

(10) Patent No.: US 9,659,972 B2
(45) Date of Patent: May 23, 2017

(54) THIN FILM TRANSISTOR ARRAY PANEL COMPRISING ETCH STOPPER FOR SHAPING A CHANNEL

(71) Applicant: SAMSUNG DISPLAY CO., LTD., Yongin, Gyeonggi-do (KR)

(72) Inventor: Eun Hyun Kim, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/466,944

(22) Filed: Aug. 22, 2014

(65) Prior Publication Data

US 2015/0236044 A1 Aug. 20, 2015

(30) Foreign Application Priority Data

Feb. 17, 2014 (KR) ........................ 10-2014-0018053

(51) Int. Cl.
  *H01L 27/12* (2006.01)
  *H01L 29/417* (2006.01)

(52) U.S. Cl.
  CPC ........ *H01L 27/124* (2013.01); *H01L 27/1248* (2013.01); *H01L 29/41733* (2013.01)

(58) Field of Classification Search
  CPC ............. H01L 27/124; H01L 29/41733; H01L 27/1248

(Continued)

(56) References Cited

U.S. PATENT DOCUMENTS 6,239,468 B1  5/2001  Chang et al.
8,309,404 B2  11/2012  Yin et al.
(Continued)

FOREIGN PATENT DOCUMENTS

JP  2009-111412 A  5/2009
KR  10-0151877 B1  6/1998
(Continued)

OTHER PUBLICATIONS

Kim, Minkyu et al., High mobility bottom gate InGaZnO thin film transistors with Si O x etch stopper, AIP Applied Physics Letters, 90, 212114 (2007), 4 pages, American Institute of Physics.

*Primary Examiner* — John P Dulka
*Assistant Examiner* — Charles R Peters
(74) *Attorney, Agent, or Firm* — Lewis Roca Rothgerber Christie LLP

(57) ABSTRACT

A thin film transistor array panel includes: a substrate; gate lines on the substrate, each of the gate lines including a gate electrode; a semiconductor layer on the substrate; an etching stopper on the semiconductor layer; a data wiring layer on the substrate and including a data line, a source electrode connected to the data line, and a drain electrode; and a passivation layer covering the source electrode, the drain electrode, and the etching stopper, where the etching stopper includes an etching prevention portion between the source electrode and the drain electrode, a shortest distance A between an upper side and a lower side of an overlap area where the etching prevention portion and the semiconductor layer overlap one another is represented by a straight line in a plane view, and a width of a channel portion of the semiconductor layer is greater than the shortest distance A.

18 Claims, 17 Drawing Sheets

(58) Field of Classification Search
USPC .......................... 257/40, 43, 59, 72; 438/158
See application file for complete search history.

(56) References Cited

U.S. PATENT DOCUMENTS

| | | |
|---|---|---|
| 8,324,111 B2 | 12/2012 | Bae et al. |
| 8,501,554 B2 | 8/2013 | Miyairi et al. |
| 2008/0299702 A1 | 12/2008 | Son et al. |
| 2011/0095296 A1 | 4/2011 | Choo et al. |
| 2013/0181217 A1* | 7/2013 | Hara .................. H01L 27/1225 |
| | | 257/43 |
| 2013/0215354 A1 | 8/2013 | Yoon et al. |

FOREIGN PATENT DOCUMENTS

| | | |
|---|---|---|
| KR | 10-0336898 B1 | 5/2002 |
| KR | 10-2006-0001428 A | 1/2006 |
| KR | 10-0752204 B1 | 8/2007 |
| KR | 10-2008-0004005 A | 1/2008 |
| KR | 10-2008-0048731 A | 6/2008 |
| KR | 10-2008-0053701 A | 6/2008 |
| KR | 10-2012-0116096 A | 10/2012 |

\* cited by examiner

THIN FILM TRANSISTOR ARRAY PANEL COMPRISING ETCH STOPPER FOR SHAPING A CHANNEL

CROSS-REFERENCE TO RELATED APPLICATION

This application claims priority to and the benefit of Korean Patent Application No. 10-2014-0018053 filed in the Korean Intellectual Property Office on Feb. 17, 2014, the entire content of which is incorporated herein by reference.

BACKGROUND

1. Field

Embodiments of the present invention relate to a thin film transistor array panel.

2. Description of the Related Art

A flat panel display, such as a liquid crystal display (LCD), an organic light emitting diode (OLED) display, an electrophoretic display, and a plasma display, includes a plurality of pairs of field generating electrodes, and electro-optical active layers therebetween. The LCD includes a liquid crystal layer as the electro-optical active layer, and the OLED display includes an organic emission layer as the electro-optical active layer. One of the field generating electrodes, of a pair of electrodes, is generally connected to a switching element to receive an electric signal, and the electro-optical active layer converts the electric signal into an optical signal to display an image.

A display panel including a thin film transistor may be included in the flat panel display. Many layers of electrodes, a semiconductor, and the like are patterned on a thin film transistor array panel, and a mask is generally used during a patterning process.

Meanwhile, a composition or structure of the semiconductor may determine a characteristic of the thin film transistor. Amorphous silicon is frequently used in such a semiconductor, but there are limits on the manufacturing of a high-performance thin film transistor including amorphous silicon due to low charge mobility in the amorphous silicon. Further, in the case of using polysilicon (e.g., polycrystalline silicon), due to high charge mobility of the polysilicon, the high-performance thin film transistor is easily manufactured, but there are limits on manufacturing a large-sized thin film transistor array panel due to high cost and low uniformity.

Accordingly, researches have been conducted for a thin film transistor using (utilizing) an oxide semiconductor, which has higher electron mobility and a higher on/off rate of current than amorphous silicon, and has a lower cost and higher uniformity than polysilicon.

To improve electron mobility of the thin film transistor, a material of the semiconductor may be changed or a channel width of the thin film transistor may be increased.

However, the increase of the channel width of the thin film transistor causes an increase of the size of the entire thin film transistor, and accordingly, an aperture ratio may be deteriorated during a manufacturing process of a display device.

The above information disclosed in this Background section is only for enhancement of understanding of the background of the invention and therefore it may contain information that does not form the prior art that is already known in this country to a person of ordinary skill in the art.

SUMMARY

Embodiments of the present invention are directed toward a thin film transistor array panel that can improve a characteristic of a thin film transistor without deterioration of an aperture ratio.

A thin film transistor array panel according to an exemplary embodiment of the present invention includes: a substrate; gate lines on the substrate, each of the gate lines including a gate electrode; a semiconductor layer on the substrate; a gate insulating layer between the gate electrode and the semiconductor layer; an etching stopper on the semiconductor layer; a data wiring layer on the substrate, the data wiring layer including a data line crossing the gate line, a source electrode connected to the data line, and a drain electrode facing the source electrode; and a passivation layer covering the source electrode, the drain electrode, and the etching stopper, where the etching stopper includes an etching prevention portion between the source electrode and the drain electrode, a shortest distance A between an upper side and a lower side of an overlap area where the etching prevention portion and the semiconductor layer overlap one another is represented by a straight line in a plane view, and a width of a channel portion of the semiconductor layer is greater than the shortest distance A.

The etching stopper may cover a portion of the semiconductor layer and have a first contact hole and a second contact hole that expose another portion of the semiconductor layer, and the source electrode may contact the semiconductor layer through the first contact hole and the drain electrode may contact the semiconductor layer through the second contact hole.

At least one of the first contact hole and the second contact hole may have two sides that face each other and are not parallel to one another.

The first contact hole may have a first planar pattern and the second contact hole may have a second planar pattern, a side of the first planar pattern and a side of the second planar pattern may face each other, and the side of the first planar pattern and a side of the source electrode adjacent to the first planar pattern are parallel with each other and the side of the second planar pattern and a side of the drain electrode adjacent to the second planar pattern may be parallel with each other.

At least one of the first contact hole and the second contact hole may have a rounded side.

An exposed portion of the semiconductor between the source electrode and the drain electrode and contacting the passivation layer may have a shape of a straight line.

The first contact hole may have a first planar pattern and the second contact hole may have a second planar pattern, and a side of the first planar pattern and a side of the second planar pattern face each other, and one of the sides of the first planar pattern and the second planar pattern may have a recess portion and the other of the sides may have a protrusion portion.

The side of the first planar pattern or the side of the second planar pattern may have two or more recess portions or two or more protrusion portions.

The first contact hole and the second contact hole may overlap the gate electrode.

The entire etching stopper may be on the substrate.

The etching stopper may be an island on the semiconductor layer.

The etching stopper may have a shape that is oblique with respect to the straight line that represents the shortest distance A.

The etching stopper may include a bent portion.

A side of the etching stopper may include a protrusion portion and an other side of the etching stopper may include a recess portion, and the one side and the other side of the etching stopper may face each other.

The protrusion portion may include a plurality of protrusions and the recess portion may include a plurality of recesses.

Each of the protrusion portion and the recess portion of the etching stopper may be rounded.

An exposed portion of the semiconductor layer between the source electrode and the drain electrode and contacting the passivation layer may have a shape of a straight line.

The source electrode and the drain electrode may overlap lateral facing edges of the etching stopper.

The passivation layer may include a lower passivation layer and an upper passivation layer on the lower passivation layer, and the lower passivation layer may include silicon oxide (SiOx) and the upper passivation layer may include silicon nitride (SiNx).

As described herein, according to an exemplary embodiment of the present invention, a channel width can be increased without an increase of the size of the thin film transistor. Accordingly, a characteristic of a thin film transistor such as charge mobility can be improved and deterioration of an aperture ratio can be prevented or avoided (e.g., reduced).

BRIEF DESCRIPTION OF THE DRAWINGS

The accompanying drawings, together with the specification, illustrate embodiments of the present invention, and, together with the description, serve to explain the principles of the present invention.

DETAILED DESCRIPTION

Figure 1:
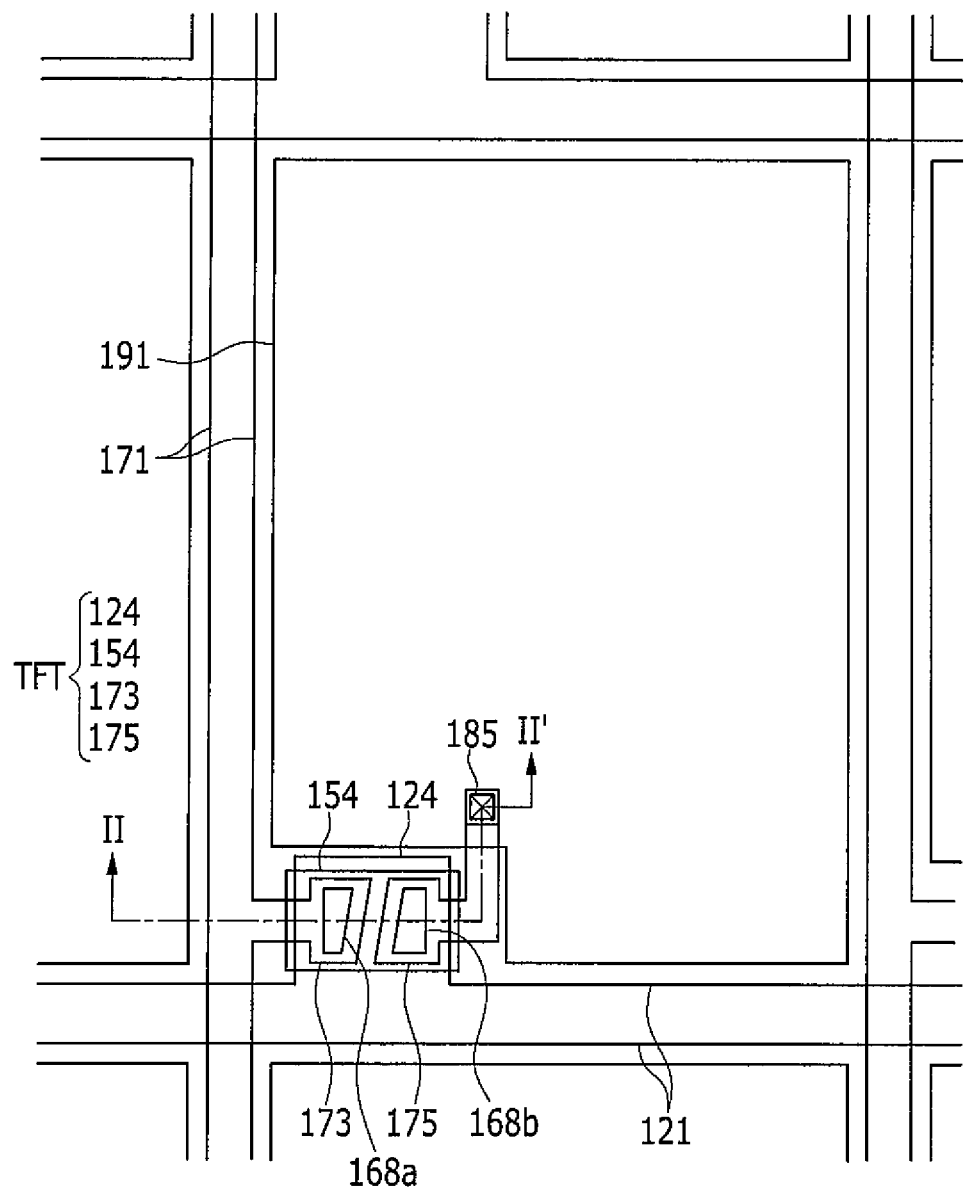
FIG. 1 is a top plan view of a thin film transistor array panel according to an exemplary embodiment of the present invention.

Hereinafter, certain exemplary embodiments of the present invention are shown and described with reference to the accompanying drawings. As those skilled in the art would realize, the described embodiments may be modified in various different ways, all without departing from the spirit or scope of the present invention. On the contrary, the exemplary embodiments described herein are provided to explain aspects of the present disclosure and, therefore, should not be construed as being limiting.

In the drawings, the thicknesses of layers, films, panels, regions, etc., may be exaggerated for clarity. It will be understood that when a layer is referred to as being "on" another layer or substrate, it can be directly on the other layer or substrate, or it can be indirectly on the other layer or substrate with one or more intervening elements present. Like reference numerals designate like elements throughout the specification. Expressions such as "at least one of," when preceding a list of elements, modify the entire list of elements and do not modify the individual elements of the list. Further, the use of "may" when describing embodiments of the present invention refers to "one or more embodiments of the present invention."

Figure 2:
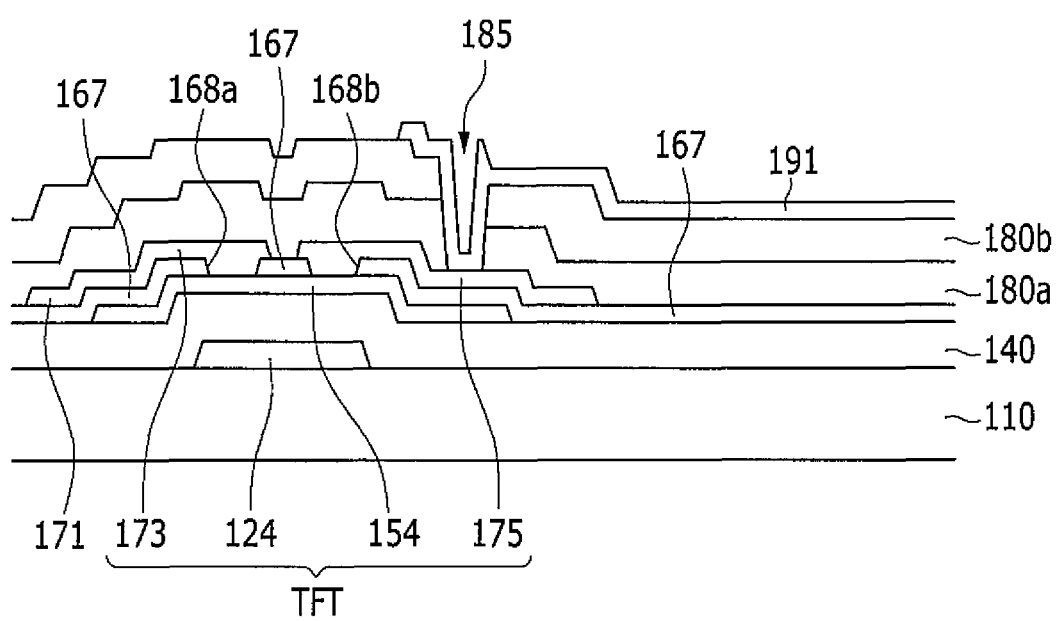
FIG. 2 is a cross-sectional view of FIG. 1, taken along the line II-II'.

FIG. 1 is a top plan view of a thin film transistor array panel according to an exemplary embodiment of the present invention. FIG. 2 is a cross-sectional view of FIG. 1, taken along the line II-II'.

Referring to FIG. 1 and FIG. 2, a plurality of gate lines 121 are formed on a substrate 110 that includes transparent glass or plastic.

The gate line 121 transmits a gate signal and extends in a substantially horizontal direction. Each gate line 121 includes a plurality of gate electrodes 124 protruded therefrom.

The gate line 121 and the gate electrode 124 may be made of (or include) any one selected from an aluminum-based metal (such as aluminum (Al) or an aluminum alloy), a silver-based metal (such as silver (Ag) or a silver alloy), and a copper-based metal (such as copper (Cu) or a copper alloy), but the gate line 121 and gate electrode 124 are not limited thereto.

In the present exemplary embodiment, the gate line 121 and the gate electrode 124 are respectively formed as a single layer, but they are not limited thereto. For example, the gate line 121 and the gate electrode 124 may be formed in a dual or triple layer form.

In an embodiment where the gate line 121 and the gate electrode 124 respectively have a dual-layer structure, the gate line 121 and the gate electrode 124 may be formed of a lower layer and an upper layer. For example, the lower layer may be formed of (or include) any one selected from a molybdenum-based metal (such as molybdenum (Mo) or a molybdenum alloy), a chromium-based metal (such as chromium (Cr) or a chromium alloy), a titanium-based metal (such as titanium (Ti) or a titanium alloy), a tantalum-based metal (such as tantalum (Ta) or a tantalum alloy), and a manganese-based metal (such as manganese (Mn) or a manganese alloy), but the lower layer is not limited thereto. The upper layer may be formed of (or include) any one selected from an aluminum-based metal (such as aluminum (Al) or an aluminum alloy), a silver-based metal (such as silver (Ag) or a silver alloy), and a copper-based metal (such as copper (Cu) or a copper alloy), but the upper layer is not limited thereto. In an embodiment including a triple-layer structure, the triple-layer structure may be formed from a combination of layers having different physical properties.

A gate insulating layer 140 is on (or formed on) the gate line 121. The gate insulating layer 140 may be made of (or include) a silicon oxide or a silicon nitride, but the gate insulating layer is not limited thereto. In the present exemplary embodiment, the gate insulating layer 140 is formed as a single layer, but it is not limited thereto. For example, the gate insulating layer 124 may be formed in (or include) a dual or triple layer form.

In some embodiments, the gate insulating layer 140 may include a first insulating layer and a second insulating layer disposed on the first insulating layer. The first insulating layer may be made of (or include) silicon nitride (SiNx) at a thickness of about 4000 Å, and the second insulating layer may be made of (or include) silicon oxide (SiOx) at a thickness of about 500 Å, but the present disclosure is not limited thereto. In another exemplary embodiment, the first insulating layer may be formed of (or include) silicon oxynitride (SION), and the second insulating layer may be formed of (or include) silicon oxide (SiOx).

A semiconductor layer 154 is on (or formed on) the gate insulating layer 140. As shown in FIG. 1, the semiconductor layer 154 may be formed as an island. However, this is not restrictive, and the semiconductor 154 may be formed at a lower end of the gate line 121 of a data line 171.

The semiconductor layer 154 of the present exemplary embodiment may be formed as (or include) an oxide semiconductor, and the oxide semiconductor may include at least one selected from tantalum (Ta), zinc (Zn), indium (In), tin (Sn), gallium (Ga), and hafnium (Hf), but the semiconductor layer is not limited thereto. For example, the semiconductor layer 154 may be formed as (or include) amorphous silicon or polysilicon instead of the oxide semiconductor.

An etching stopper 167 is disposed on the semiconductor layer 154. In the present exemplary embodiment, the etching stopper 167 may wholly cover the semiconductor layer 154. A first contact hole 168a and a second contact hole 168b that partially expose the semiconductor layer 154 (e.g., expose a portion of the semiconductor layer 154) are formed (or included) in the etching stopper 167. The etching stopper 167 may be entirely (or substantially entirely) on (or formed on) the substrate 110 (e.g., the entire etching stopper 167 may be on the substrate 110).

In the present exemplary embodiment, the first contact hole 168a and the second contact hole 168b may be formed (or present) in portions of the etching stopper 167 that overlap the gate electrode 124.

A data line 171, a source electrode 173 connected with the data line 171, and a drain electrode 175 facing the source electrode 173 are on (or formed on) the gate insulating layer 140 or the etching stopper 167.

The data line 171 transmits a data signal, and extends in a substantially vertical direction and thus crosses the gate line 121. Each data line 171 is connected with the source electrode 173, which protrudes toward the gate electrode 124.

A data wiring layer including the data line 171, the source electrode 173, and the drain electrode 175 may be made of (or include) at least one selected from an aluminum-based metal (such as aluminum (Al) or an aluminum alloy), a silver-based metal (such as silver (Ag) or a silver alloy), a copper-based metal (such as copper (Cu) or a copper alloy), a molybdenum-based metal (such as molybdenum (Mo) or a molybdenum alloy), a chromium-based metal (such as chromium (Cr) or a chromium alloy), a titanium-based metal (such as titanium (Ti) or a titanium alloy), a tantalum-based metal (such as tantalum (Ta) or a tantalum alloy), a manganese-based metal (such as manganese (Mn) or a manganese alloy), but the present disclosure is not limited thereto.

In the present exemplary embodiment, the data line 171, the source electrode 173, and the drain electrode 175 are formed as a single layer, but the present disclosure is not limited thereto. For example, each of the data line 171, the source electrode 173, and the drain electrode 175 may be formed as a dual or triple layer.

When the data line 171, the source electrode 173, and the drain electrode 175 have a dual-layer structure, the data line 171, the source electrode 173, and the drain electrode 175 may be formed of (or include) a lower layer and an upper layer, and the lower layer may be made of (or include) at least one selected from a molybdenum-based metal (such as molybdenum (Mo) or a molybdenum alloy), a chromium-based metal (such as chromium (Cr) or a chromium alloy), a titanium-based metal (such as titanium (Ti) or a titanium alloy), a tantalum-based metal (such as tantalum (Ta) or a tantalum alloy), a manganese-based metal (such as manganese (Mn) or a manganese alloy), and the upper layer may be made of (or include) at least one selected from an aluminum-based metal (such as aluminum (Al) or an aluminum alloy), a silver-based metal (such as silver (Ag) or a silver alloy), and a copper-based metal such as (copper (Cu) or a copper alloy). In an embodiment including a triple-film structure, films having different physical properties may be combined adjacent to each other.

The drain electrode 175 includes a side that is separated from the data line 171 and faces one side of the source electrode 173 in parallel or substantially in parallel (e.g., a surface of the drain electrode 175 is parallel or substantially parallel to a surface of the source electrode 173). The source electrode 173 and the drain electrode 175 may have any suitable shape, and the shape may be modified in various ways.

In the present exemplary embodiment, the source electrode 173 contacts the semiconductor layer 154 through the first contact hole 168a and the drain electrode 175 contacts the semiconductor layer 154 through the second contact hole 168b.

One gate electrode 124, one source electrode 173, and one drain electrode 175 form one thin film transistor (TFT) together with the semiconductor layer 154. In the present exemplary embodiment, a channel portion of the semiconductor layer 154 may be disposed in a lower portion of the etching stopper 167 that is disposed between the first contact hole 168a and the second contact hole 168b (e.g., the channel portion of the semiconductor layer 154 may be below the portion of the etching stopper 167 that is between the first contact hole 168a and the second contact hole 168b).

Hereinafter, the shape of the thin film transistor according to the present exemplary embodiment will be described with reference to FIG. 3.

Figure 3:
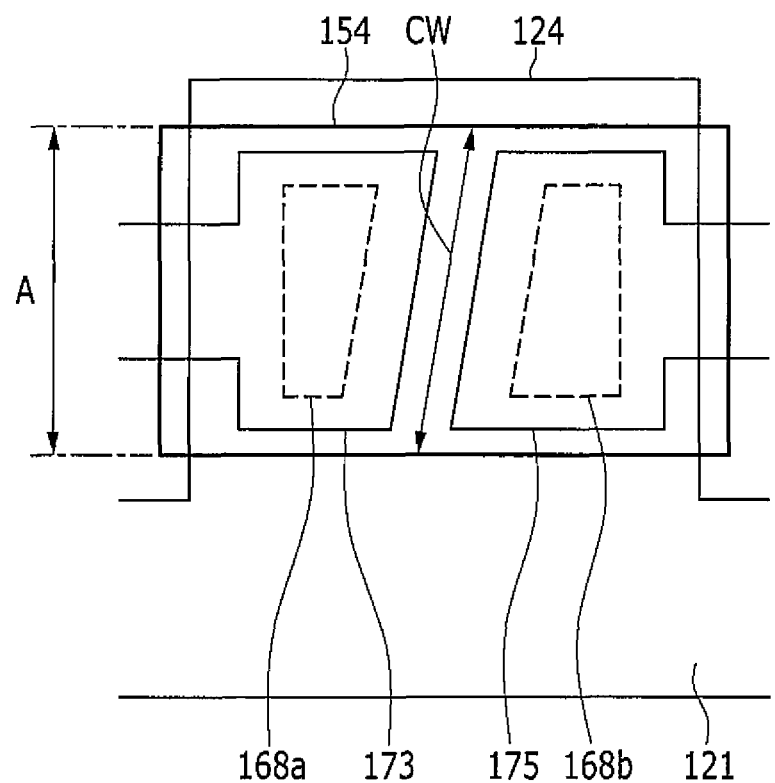
FIG. 3 is a top plan view illustrating the shape of a thin film transistor in the exemplary embodiment of FIG. 1.

FIG. 3 is a top plan view illustrating the shape of the thin film transistor of FIG. 1.

Referring to FIGS. 1 to 3, the first contact hole 168a and the second contact hole 168b formed (or included) in the etching stopper 167 are respectively located in the left side and the right side (relative to the perspective shown in FIG. 3), and the first contact hole 168a and the second contact hole 168b each have a trapezoidal planar pattern. A first planar pattern of the first contact hole 168a has an oblique side that is adjacent to (or facing) the second contact hole 168b. Corresponding to the oblique side of the first planar pattern, a second planar pattern has an oblique side that is adjacent to (or facing) the first contact hole 168a. The two sides may be parallel (or substantially parallel) with each other (e.g., the oblique side of the first planar pattern may be parallel or substantially parallel to the oblique side of the second planar pattern). One side (e.g., an oblique side) of the source electrode 173 and one side (e.g., an oblique side) of the drain electrode 175 may be obliquely parallel (or substantially obliquely parallel) with the oblique sides of the first and second contact holes 168a and 168b. However, a side of the source electrode 173 and a side of the drain electrode 175 may respectively be one side of a rectangle regardless of the shape of each of the first and second contact holes 168a and 168b. For example, although the one side of the source electrode 173 and the one side of the drain electrode 175 may be parallel (or substantially parallel) with the oblique sides of the first and second contact holes 168a and 168b, the remaining sides of the source electrode 173 and drain electrode 175 may have orientations that differ from the respective orientations of the remaining sides of the first and second contact holes 168a and 168b.

In the present exemplary embodiment, the side (or edge) of the first planar pattern of the first contact hole 168a and the side (or edge) of the second planar pattern of the second contact hole 168b that face each other are oblique-shaped, and thus the shape of the channel portion formed in the etching stopper 167 is oblique (or oblique shaped). Accordingly, a width CW of the channel portion in the present exemplary embodiment may be as shown in FIG. 3. The etching stopper 167 includes an etching prevention portion (e.g., a portion that prevents or reduces etching) disposed between the source electrode 173 and the drain electrode 175, and the shortest distance A between an upper side and a lower side of an overlap area where the etching prevention portion and the semiconductor layer 154 are overlapped with each other is as shown in FIG. 3. In a thin film transistor according to a comparative example, the first contact hole 168a and the second contact hole 168b are respectively formed in the shape of a rectangle, and thus the width of the channel portion is equal to the shortest distance A of FIG. 3. However, because the shape of the channel portion is oblique in the present exemplary embodiment, the width CW of the channel portion may be increased without regard to the entire side of the thin film transistor (e.g., the width CW of the channel portion may be longer than the shortest distance A across an overlap area of the etching prevention portion and the semiconductor layer 154).

Passivation layers 180a and 180b are disposed on the data line 171, the source electrode 173, the drain electrode 175, the etching stopper 167, and exposed portion of the semiconductor layer 154.

The passivation layers 180a and 180b may be formed of (or include) silicon oxide (SiOx), silicon nitride (SiNx), silicon oxynitride (SiON), or an organic layer, but the passivation layers are not limited thereto. The passivation layers 180a and 180b include a lower passivation layer 180a and an upper passivation layer 180b, and the lower passivation layer 180a may be formed of (or include) silicon oxide (SiOx) or silicon oxynitride (SiON), and the upper passivation layer 180b may be formed of (or include) a silicon nitride (SiNx) or an organic layer, but the present disclosure is not limited thereto. The upper passivation layer 180b may be omitted as desired (or necessary).

A pixel electrode 191 is disposed on the passivation layers 180a and 180b. The pixel electrode 191 is physically and electrically connected to the drain electrode 175 through a contact hole 185, and the pixel electrode 191 receives a data voltage from the drain electrode 175.

Hereinafter, exemplary variations of the shape of the thin film transistor included in the thin film transistor array panel according to the exemplary embodiment of the present invention will be described with reference to FIGS. 4 to 7.

Figure 4:
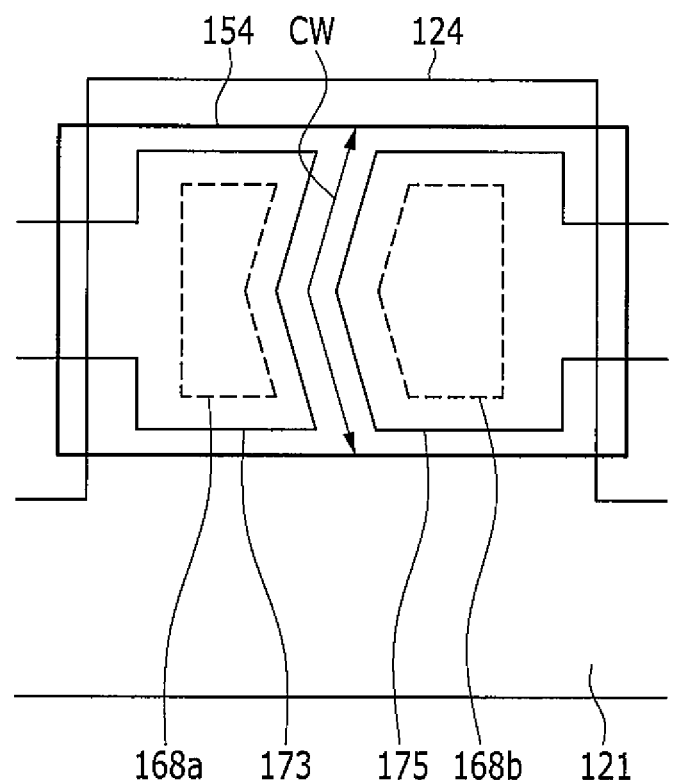
FIGS. 4 to 7 are top plan views of thin film transistors according to exemplary embodiments of the present invention.

Referring to FIG. 4, the exemplary variation has the same (or substantially the same) structure as the exemplary embodiment of FIG. 3, except for the shape of a first contact hole 168a and the shape of a second contact hole 168b. In the present exemplary variation, the first contact hole 168a and the second contact hole 168b respectively have bent (or deflected) edges. In the present exemplary variation, each side where a first planar pattern of the first contact hole 168a and a second planar pattern of the second contact hole 168b face each other is an oblique line including a bent portion, and thus the shape of a channel portion formed in a lower end of an etching stopper 167 is also bent (or deflected). For example, the side of the first planar pattern of the first contact hole 168a facing the second contact hole 168b may extend along two different directions, and the side of the second planar pattern of the second contact hole 168b facing the first contact hole 168a may extend along two directions such that the sides of the first planar pattern of the first contact hole 168a and the second planar pattern of the second contact hole 168b facing each other are also parallel (or substantially parallel) to one another. Accordingly, a width CW of the channel portion of the present exemplary variation may be as shown in FIG. 4. Thus, the width of the channel portion is increased compared to a comparative example where the first contact hole 168a and the second contact hole 168b are respectively formed in the shape of a rectangle.

Figure 5:
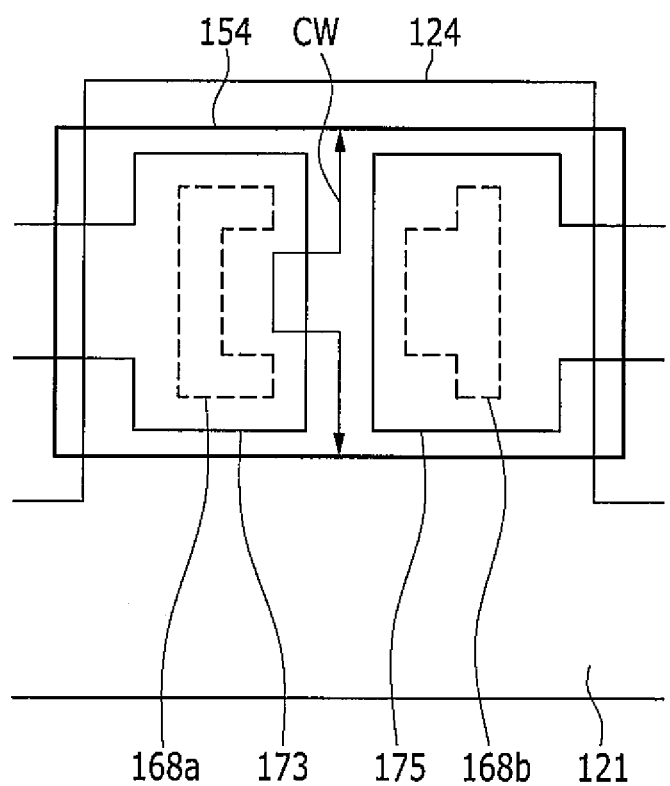

An exemplary variation of FIG. 5 has the same (or substantially the same) structure as the exemplary embodiment of FIG. 3, except for the shape of a first contact hole 168a and the shape of a second contact hole 168b. In the present exemplary embodiment, one side of a first planar pattern formed by the first contact hole 168a forms a recess portion, and one side of a second planar pattern formed by the second contact hole 168b forms a convex portion (or protrusion portion). The recess portion may be recessed away from the one side of the second planar pattern, and the protrusion portion may protrude toward the one side of the first planar pattern. The recess portion of the first planar pattern and the convex portion of the second planar pattern may correspond to one another in an interlocking pattern (e.g., may be interlocked with each other).

In the present exemplary variation, the sides where the first planar pattern of the first contact hole 168a and the second planar pattern of the second contact hole 168b face each other are bent and thus respectively form the recess portion and the convex portion, and thus the shape of the channel portion formed in a lower end of an etching stopper 167 is also bent. Accordingly, a width CW of the channel portion may be as shown in FIG. 5 in the present exemplary variation. Thus, the width of the channel portion is increased compared to a comparative example where the first contact hole 168a and the second contact hole 168b are respectively formed in the shape of a rectangle.

Figure 6:
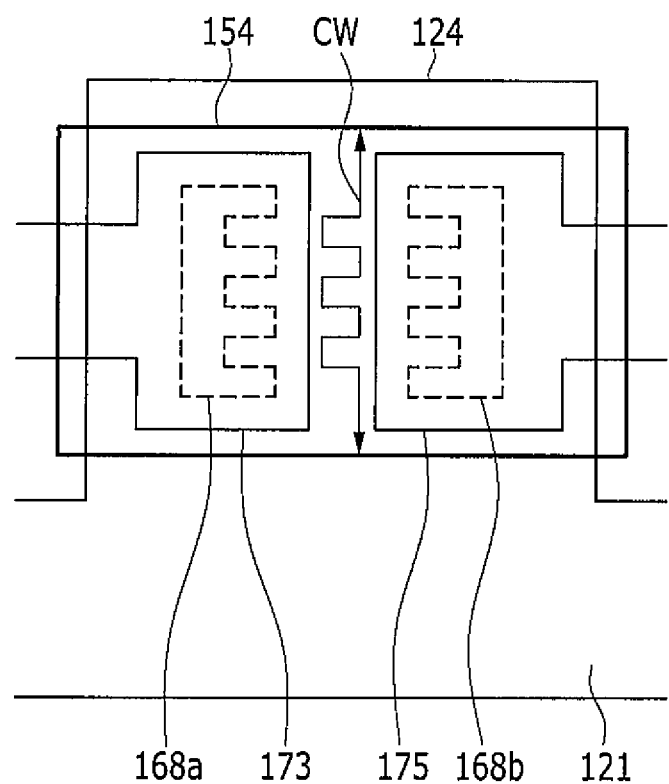

An exemplary variation of FIG. 6 has the same (or substantially the same) structure as the exemplary embodiment of FIG. 5, except that a recess portion and a convex portion (or protrusion portion) are respectively disposed in plural (e.g., one side of a first planar pattern of the first contact hole 168a has a plurality of recess portions, and one side of a second planar pattern of the second contact hole 168b has a plurality of convex portions). Compared to the exemplary embodiment of FIG. 5, a portion that is bent several times is included and thus a width CW of a channel portion of the present exemplary variation is greater than the width CW of the exemplary embodiment of FIG. 5, and the width CW of the channel portion may be as shown in FIG. 6.

Figure 7:
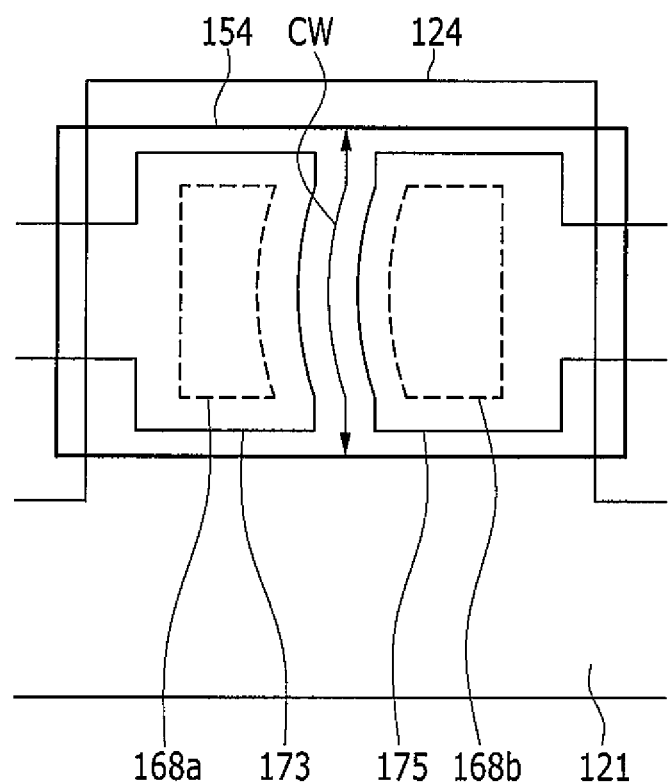

An exemplary variation of FIG. 7 has the same (or substantially the same) structure as the exemplary embodiment of FIG. 3, except for the shape of a first contact hole 168a and the shape of a second contact hole 168b. In the present exemplary variation, the first contact hole 168a and the second contact hole 168b respectively have one rounded side (e.g., one of the sides is a convex rounded side and the other of the sides is a concave rounded side having a shape corresponding to that of the convex rounded side). In the present exemplary variation, sides where a first planar pattern of the first contact hole 168a and a second planar pattern of the second contact hole 168b face each other are rounded, and thus a channel portion formed in a lower end of an etching stopper 167 has a rounded shape. Accordingly, a width CW of the channel portion of the present exemplary variation may be as shown in FIG. 7. Thus, the width of the channel portion is increased compared to a comparative example where the first contact hole 168a and the second contact hole 168b are respectively formed in the shape of a rectangle.

Figure 8:
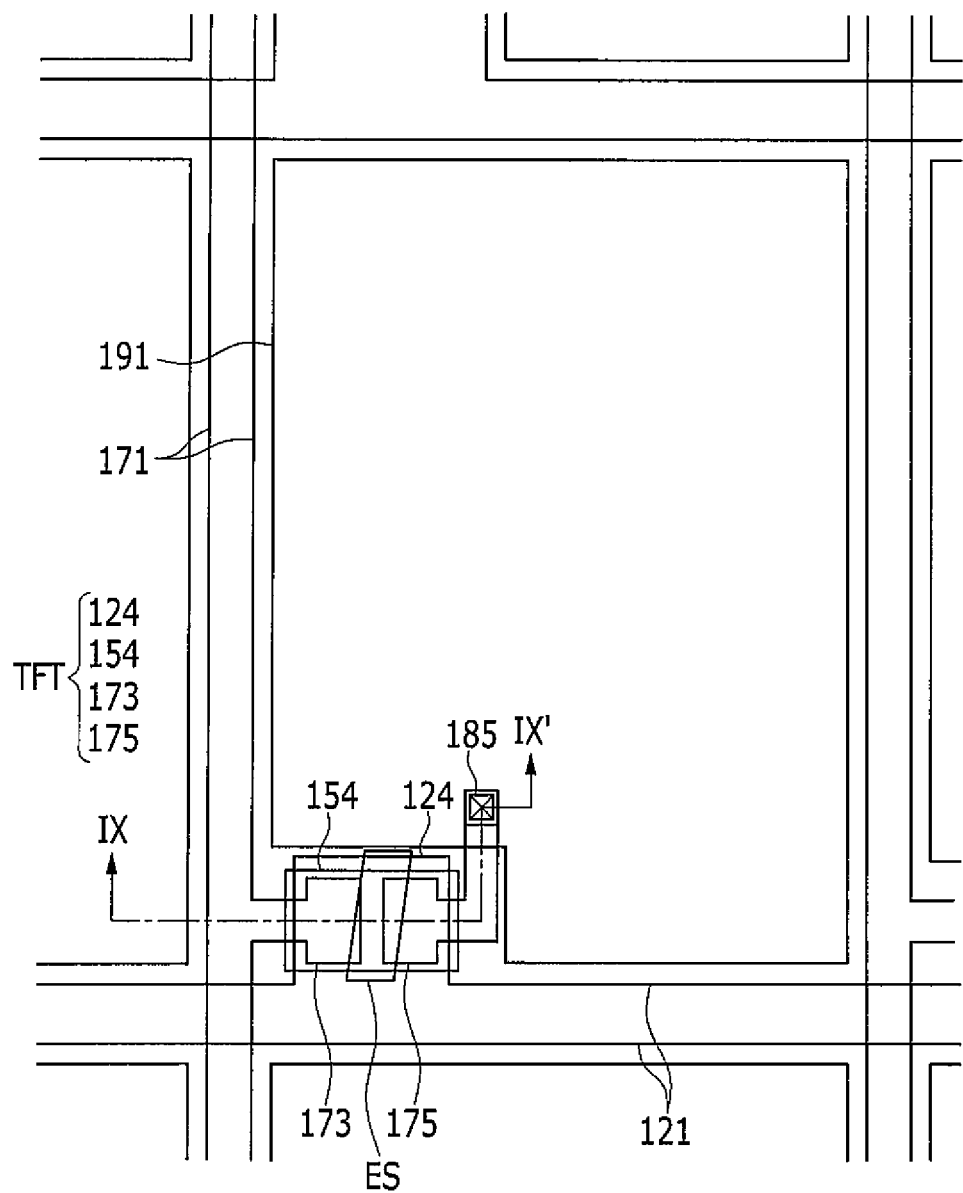
FIG. 8 is a top plan view of a thin film transistor array panel according to an exemplary embodiment of the present invention.
Figure 9:
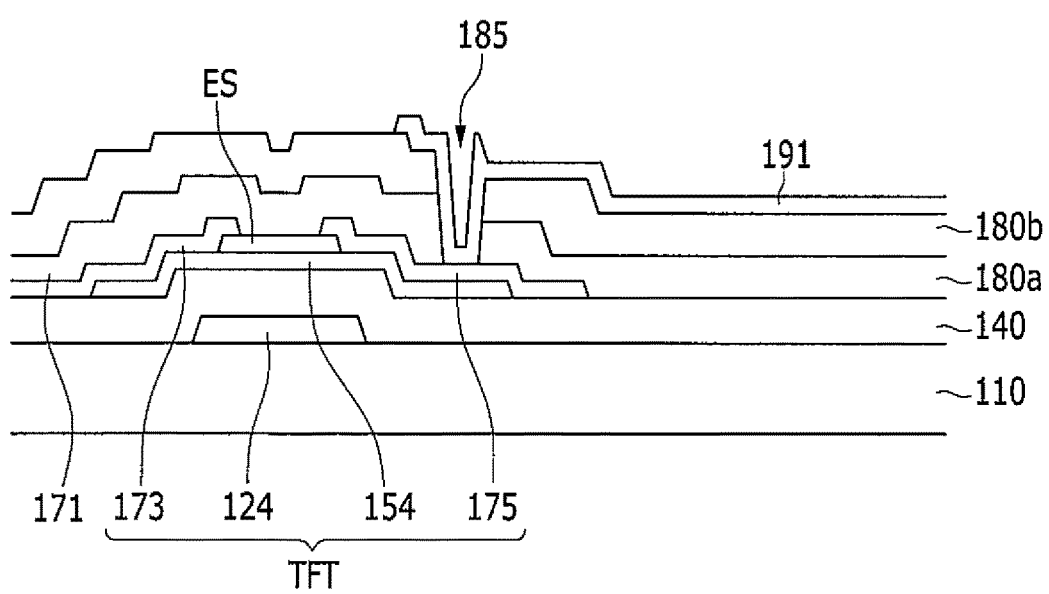
FIG. 9 is a cross-sectional view of FIG. 8, taken along the line IX-IX'.

FIG. 8 is a top plan view of a thin film transistor array panel according to an exemplary embodiment of the present invention. FIG. 9 is a cross-sectional view of FIG. 8, taken along the line IX-IX'.

The exemplary embodiment of FIG. 8 and FIG. 9 is almost the same (or substantially the same) as the exemplary embodiment of FIG. 1 and FIG. 2. However, an etching stopper ES is different, and thus the following description will focus mainly on the differences.

In the present exemplary embodiment, the etching stopper ES is disposed on a semiconductor layer 154 at a portion overlapping a gate electrode 124, and may be formed as an island. Unlike the etching stopper 167 described with reference to FIG. 1 and FIG. 2, a first contact hole 168a and a second contact hole 168b are not formed in the etching stopper ES of the present exemplary embodiment. In the present exemplary embodiment, a channel portion of the semiconductor layer 154 may be disposed in a lower portion of the etching stopper ES (e.g., a channel portion of the semiconductor layer 154 may be below the etching stopper ES).

Hereinafter, the shape of the thin film transistor of the present exemplary embodiment will be described with reference to FIG. 10.

Figure 10:
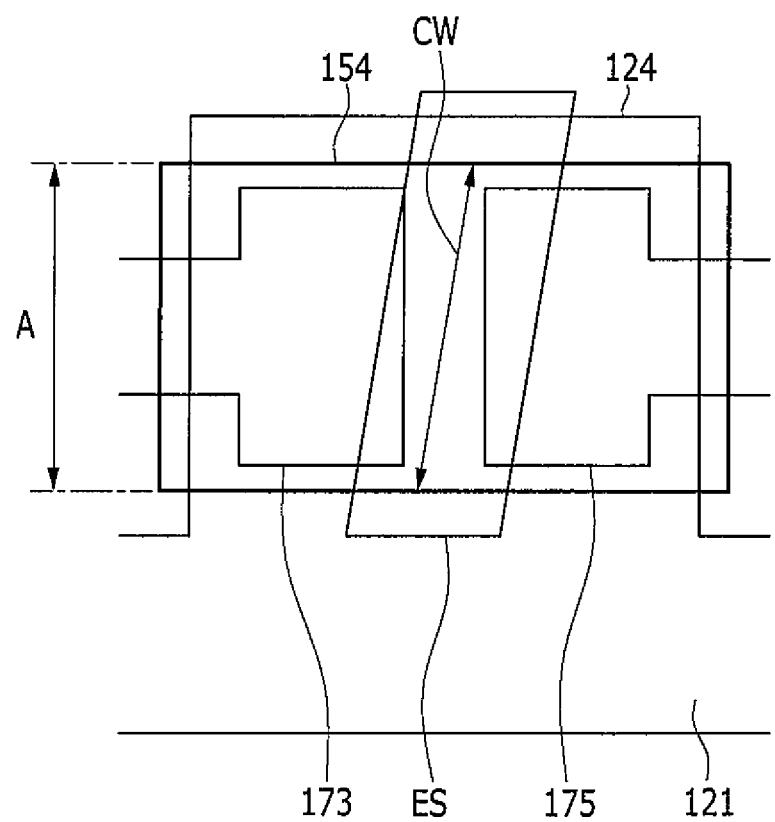
FIG. 10 is a top plan view illustrating the shape of the thin film transistor of the exemplary embodiment of FIG. 8.

FIG. 10 is a top plan view illustrating the shape of the thin film transistor of the exemplary embodiment of FIG. 8.

Referring to FIGS. 8 to 10, the etching stopper ES formed in (or having) the shape of an island forms a trapezoidal planar pattern. The etching stopper ES is inclined to the right side with reference to a straight line (e.g., a substantially straight line) that indicates the shortest distance A, but the present disclosure is not limited thereto (e.g., the etching stopper ES may be inclined to the left side with reference to the straight line that indicates the shortest distance A). A side of the source electrode 173 and a side of the drain electrode 175 that face each other are parallel (or substantially parallel) with the straight line (e.g., the substantially straight line) that indicates the shortest distance A without regard to (or independent of) the oblique shape of the etching stopper ES, but the present disclosure is not limited thereto. For example, the side of the source electrode 173 and the side of the drain electrode 175 that face each other may be oblique and have a degree of inclination corresponding to a respective degree of inclination of the etching stopper ES.

In the present exemplary embodiment, the etching stopper ES is formed in (or has) the shape of a trapezoid, and therefore the shape of a channel portion formed in a lower end of the etching stopper ES may be trapezoidal. Thus, the width CW of the channel portion of the present exemplary embodiment may be as shown in FIG. 10. The etching stopper 167 includes an etching prevention portion disposed between the source electrode 173 and the drain electrode 175, and the shortest distance A between an upper side and a lower side of an overlap area where the etching prevention portion and the semiconductor layer 154 are overlapped with each other is as shown in FIG. 10. In a comparative example, the etching stopper ES is formed in the shape of a rectangle, and thus the width of the channel portion may be the same (or substantially the same) as the shortest distance A shown in FIG. 10. However, because the shape of the channel portion is oblique in the present exemplary embodiment, the width CW of the channel portion may be increased without regard to the entire side of the thin film transistor (e.g., the width CW of the channel portion may be longer than the shortest distance A across an overlap area of the etching prevention portion and the semiconductor layer 154).

The contents and features described with reference to FIG. 1 and FIG. 2 are applicable to any of the exemplary embodiments described herein, except for the above-described differences.

Hereinafter, an exemplary variation of the shape of the thin film transistor included in the thin film transistor array panel according to the exemplary embodiment of the present invention will be described with reference to FIGS. 11 to 14.

FIGS. 11 to 14 are top plan views illustrating a thin film transistor according to an exemplary embodiment of the present invention.

Figure 11:
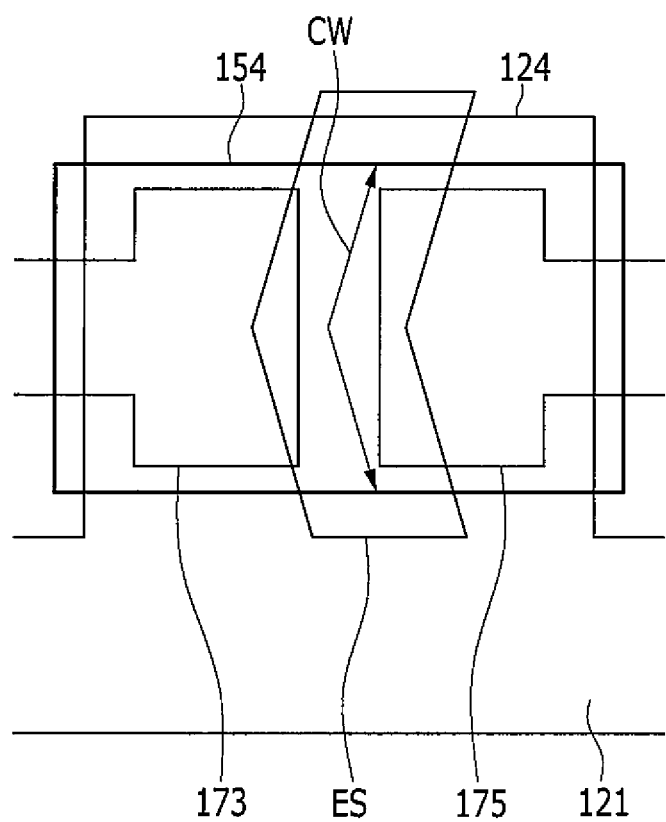
FIGS. 11 to 14 are top plan views of thin film transistors according to exemplary embodiments of the present invention.

Referring to FIG. 11, the thin film transistor of FIG. 11 has the same (or substantially the same) structure as the thin film transistor of FIG. 10, except for the shape of an etching stopper ES. In the present exemplary embodiment, the etching stopper ES includes a bent portion (e.g., the etching stopper ES extends in two different directions).

The etching stopper ES of the present exemplary embodiment is oblique and includes a bent portion, and thus the shape of a channel portion formed in a lower end of the etching stopper ES has a corresponding bent shape. Accordingly, a width CW of the channel portion of the present exemplary embodiment may be as shown in FIG. 11. Thus, the width of the channel portion is increased compared to a comparative example where the etching stopper ES is formed in (or has) the shape of a rectangle.

Figure 12:
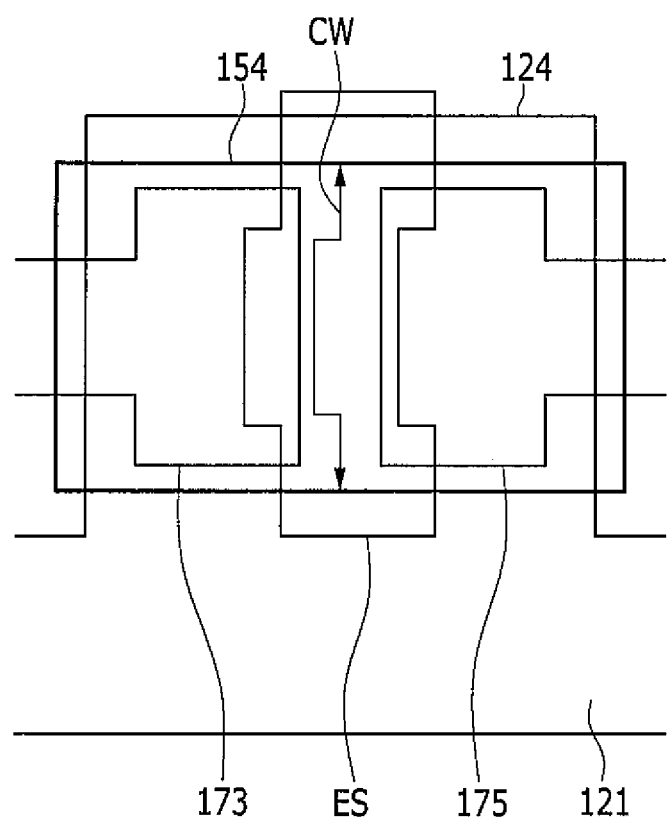

Referring to FIG. 12, a thin film transistor has the same (or substantially the same) structure as the thin film transistor according to the exemplary embodiment of FIG. 10, except for the shape of an etching stopper ES. In the present exemplary embodiment, sides of the etching stopper ES that face (or face away from) each other form a convex portion (or protrusion portion) and a recess portion. The convex portion and the recess portion respectively formed in the sides that face (or face away from) each other may correspond to one another in an interlocking pattern (e.g., may be interlocked with each other).

In the present exemplary embodiment, the sides of the etching stopper ES that face (or face away from) each other are bent while forming the recess portion and the convex portion, respectively, and thus the shape of a channel portion formed in a lower end of the etching stopper ES (e.g., below the etching stopper ES) also has a bent shape. Accordingly, a width CW of the channel portion may be as shown in FIG. 12. Thus, the width of the channel portion is increased compared to a comparative example where the etching stopper ES is formed in (or has) the shape of a rectangle.

Figure 13:
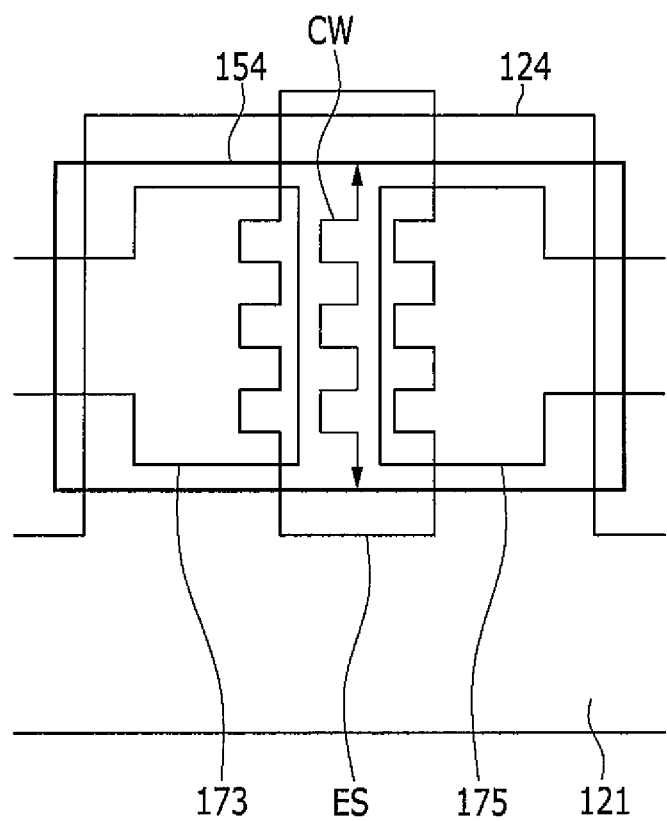

Referring to FIG. 13, a thin film transistor of the present exemplary embodiment has the same (or substantially the same) structure as the thin film transistor as the exemplary embodiment of FIG. 12, except that a recess portion and a convex portion (or protrusion portion) are disposed in plural (e.g., sides of the etching stopper ES that face (or face away from) each other form a plurality of convex portions and a plurality of recess portions). Because the thin film transistor of the exemplary embodiment of FIG. 13 includes a portion that is bent several times, a width CW of a channel portion is greater than the width CW of the channel portion of FIG. 12, and the width CW of the channel portion may be as shown in FIG. 13.

Figure 14:
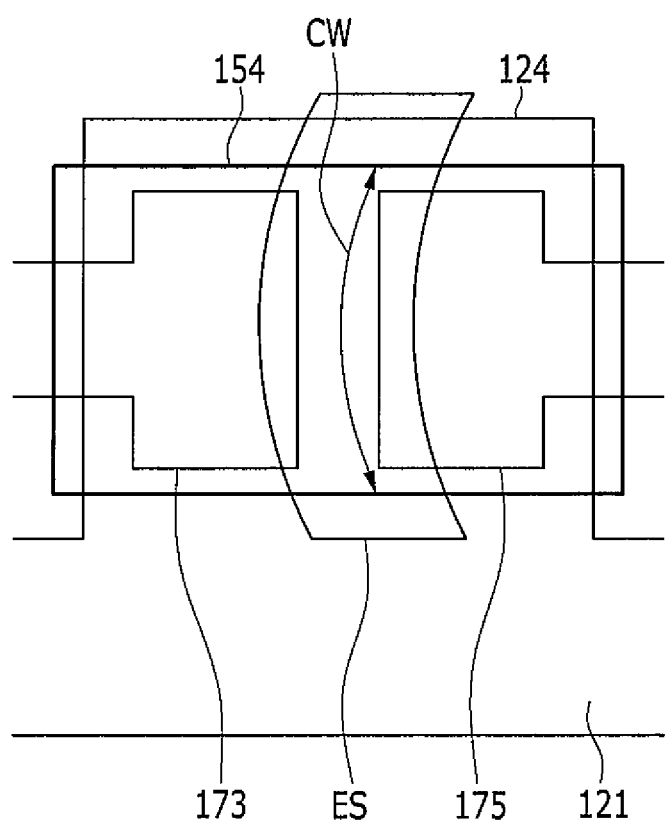

A thin film transistor of FIG. 14 has the same (or substantially the same) structure as the thin film transistor of FIG. 10, except for the shape of an etching stopper ES. In the present exemplary embodiment, sides of the etching stopper ES are rounded.

In the present exemplary embodiment, the sides that face (or face away from) each other in the etching stopper ES are rounded (e.g., one of the sides is a convex rounded side and the other of the sides is a concave rounded side having a shape corresponding to that of the convex rounded side), and thus a channel portion formed in a lower end of the etching stopper ES has a rounded shape. Accordingly, a width CW of the channel portion of the present exemplary embodiment may be as shown in FIG. 14. Thus, the width of the channel portion is increased compared to a case that the etching stopper ES is formed in or has the shape of a rectangle.

Figure 15:
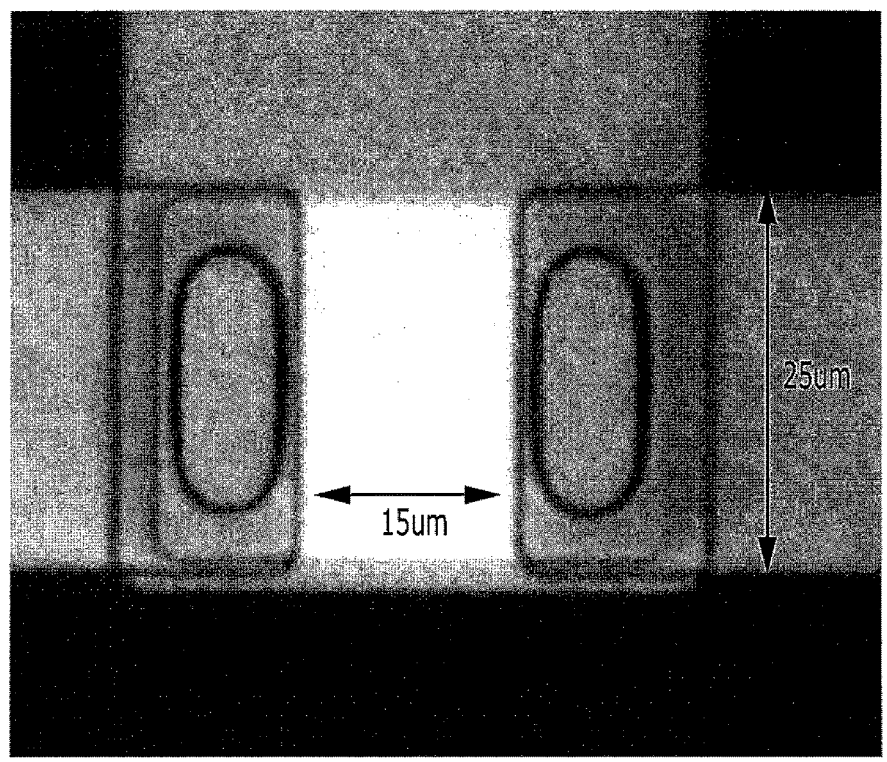
FIG. 15 is a photograph of a thin film transistor according to a comparative example.
Figure 16:
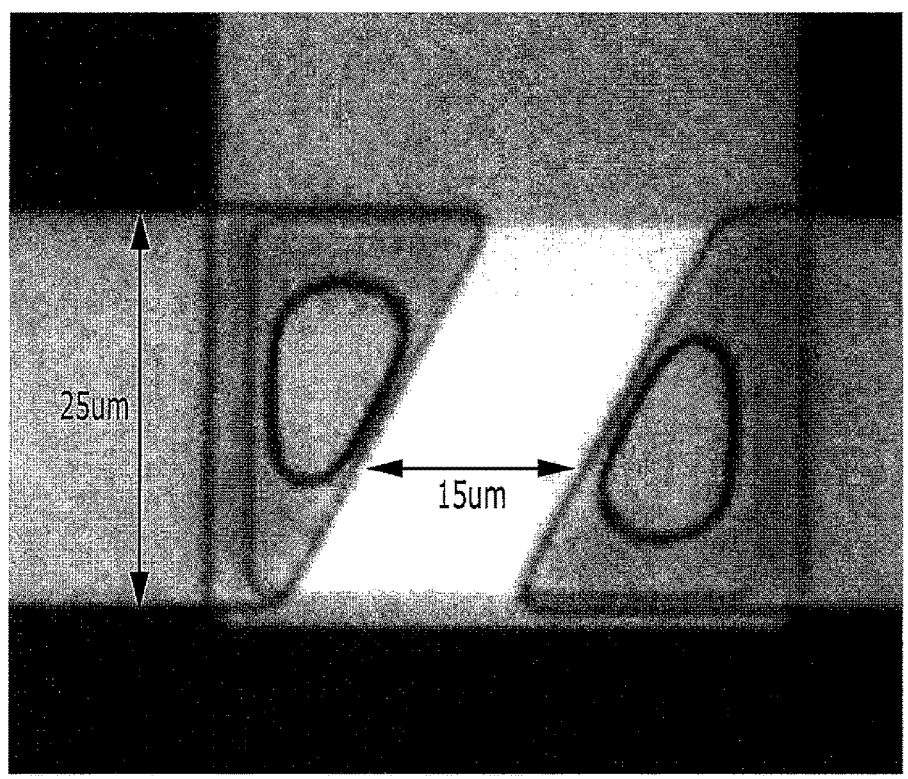
FIG. 16 is a photograph of another thin film transistor according to an exemplary embodiment of the present invention.

FIG. 15 is a photograph of a thin film transistor according to a comparative example. FIG. 16 is a photograph of another thin film transistor according to an exemplary embodiment of the present invention.

Referring to FIG. 15, contact holes formed in an etching stopper of the comparative example are substantially formed in (or substantially have) the shape of a rectangle, and referring to FIG. 16, contact holes formed in an etching stopper are similar in shape to the contact holes of the exemplary embodiment of FIG. 3.

Figure 17:
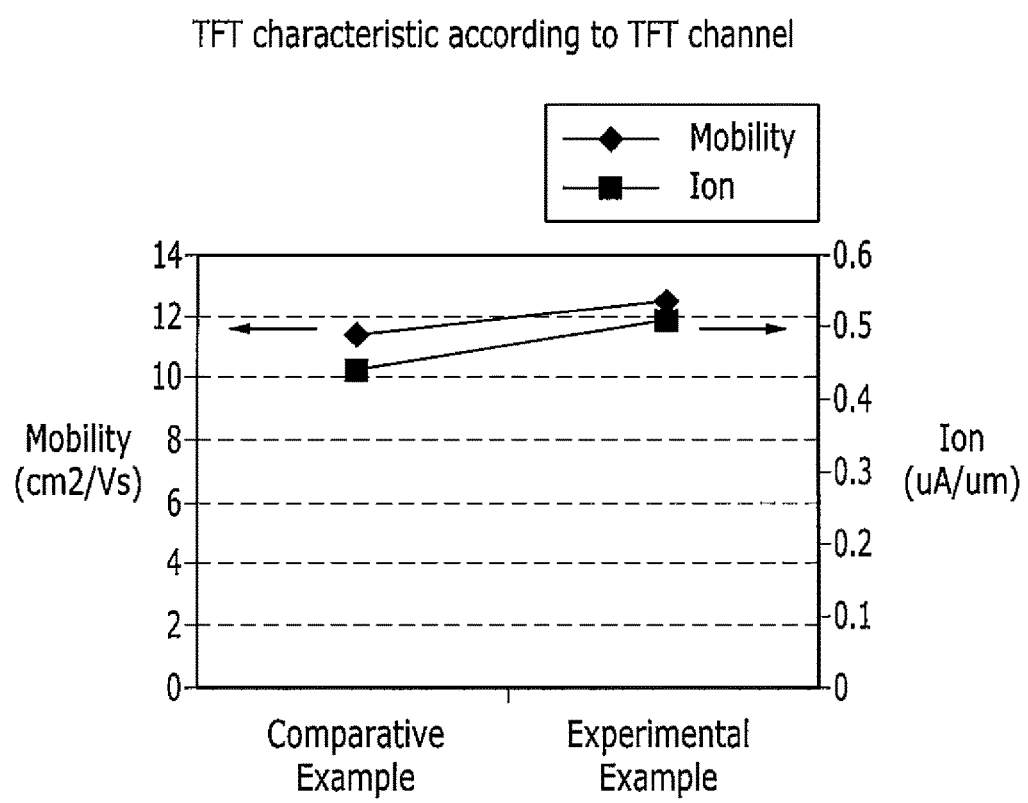
FIG. 17 is a graph showing a comparison of a characteristic of the thin film transistor according to the comparative example shown in FIG. 15 and a characteristic of a thin film transistor according to the exemplary embodiment shown in FIG. 16.

FIG. 17 is a graph comparing transistor characteristics of the comparative example of FIG. 15 and the exemplary embodiment of FIG. 16.

Referring to FIG. 17, when the shape of the channel portion is changed, charge mobility and an on-off rate of current are increased in the exemplary embodiment of the present invention, as compared to the comparative example.

The thin film transistors described in the above-described exemplary embodiments of the present invention may be applied to any suitable display device such as a liquid crystal display, an organic light emitting display device, or the like.

While the present invention has been described in connection with what are presently considered to be practical exemplary embodiments, it is to be understood that the invention is not limited to the disclosed embodiments, but, on the contrary, is intended to cover various modifications and equivalent arrangements included within the spirit and scope of the appended claims, and equivalents thereof.

---

Description of Certain Reference Numerals

| | |
|---|---|
| 110 substrate | 121 gate line |
| 154 semiconductor layer | 167 etching stopper |
| 168a, 168b first contact hole, second contact hole | |
| 171 data line | 173 source electrode |
| 175 drain electrode | |
| 180a, 180b upper and lower passivation layers | |

---

What is claimed is:

1. A thin film transistor array panel comprising:
a substrate;
a gate electrode on the substrate;
a semiconductor layer on the substrate;
a gate insulating layer between the gate electrode and the semiconductor layer;
an etching stopper on the semiconductor layer;
a source electrode and a drain electrode facing the source electrode on the substrate; and
a passivation layer covering the source electrode, the drain electrode, and the etching stopper,
wherein the etching stopper has a first contact hole and a second contact hole,
wherein the first contact hole and the second contact hole have complementary shapes such that a combination of the first and second contact holes along a direction in which the first and second contact holes face each other on the same plane has a substantially quadrangular shape in a plan view,
wherein the etching stopper comprises an etching prevention portion between the source electrode and the drain electrode,
wherein a shortest distance A between an upper side and a lower side of an overlap area where the etching prevention portion and the semiconductor layer overlap one another is represented by a straight line in a plan view, and
wherein a width of a channel portion of the semiconductor layer is greater than the shortest distance A.

2. The thin film transistor array panel of claim 1, wherein the etching stopper covers a portion of the semiconductor layer,
the first contact hole and the second contact hole expose another portion of the semiconductor layer, and
the source electrode contacts the semiconductor layer through the first contact hole and the drain electrode contacts the semiconductor layer through the second contact hole.

3. The thin film transistor array panel of claim 2, wherein the first contact hole and the second contact hole overlap the gate electrode.

4. The thin film transistor array panel of claim 2, wherein the entire etching stopper is on the substrate.

5. The thin film transistor array panel of claim 1, wherein the etching stopper comprises a bent portion.

6. The thin film transistor array panel of claim 5, wherein a side of the etching stopper comprises a protrusion portion and an other side of the etching stopper comprises a recess portion and the one side and the other side of the etching stopper face each other.

7. The thin film transistor array panel of claim 6, wherein the protrusion portion comprises a plurality of protrusions and the recess portion comprises a plurality of recesses.

8. The thin film transistor array panel of claim 6, wherein each of the protrusion portion and the recess portion of the etching stopper is rounded.

9. The thin film transistor array panel of claim 1, wherein the source electrode and the drain electrode overlap lateral facing edges of the etching stopper.

10. The thin film transistor array panel of claim 1, wherein the passivation layer comprises a lower passivation layer and an upper passivation layer on the lower passivation layer, and the lower passivation layer comprises silicon oxide (SiOx) and the upper passivation layer comprises silicon nitride (SiNx).

11. The thin film transistor array panel of claim 1, wherein each of the first contact hole and the second contact hole does not have a quadrangular shape.

12. The thin film transistor array panel of claim 1, wherein a combination of the first and second contact holes without overlapping the first contact hole and the second contact hole along a direction in which the first and second contact holes face each other has the substantially quadrangular shape in the plan view.

13. A thin film transistor array panel comprising:
a substrate;
a gate electrode on the substrate;
a semiconductor layer on the substrate;
a gate insulating layer between the gate electrode and the semiconductor layer;
an etching stopper on the semiconductor layer;
a source electrode, and a drain electrode facing the source electrode on the substrate; and
a passivation layer covering the source electrode, the drain electrode, and the etching stopper,
wherein the etching stopper comprises an etching prevention portion between the source electrode and the drain electrode, covers a portion of the semiconductor layer, and has a first contact hole and a second contact hole exposing another portion of the semiconductor layer, and having complementary shapes such that a combination of the first and second contact holes along a direction in which the first and second contact holes face each other has a substantially quadrangular shape in a plan view,
wherein at least one of the first contact hole and the second contact hole has two sides that face each other and are not parallel to one another,
wherein the source electrode contacts the semiconductor layer through the first contact hole,
wherein the drain electrode contacts the semiconductor layer through the second contact hole,
wherein a shortest distance A between an upper side and a lower side of an overlap area where the etching prevention portion and the semiconductor layer overlap one another is represented by a straight line in a plan view, and
wherein a width of a channel portion of the semiconductor layer is greater than the shortest distance A.

14. The thin film transistor array panel of claim 13, wherein the first contact hole has a first planar pattern and the second contact hole has a second planar pattern,
a side of the first planar pattern and a side of the second planar pattern face each other, and
the side of the first planar pattern and a side of the source electrode adjacent to the first planar pattern are parallel with each other and the side of the second planar pattern and a side of the drain electrode adjacent to the second planar pattern are parallel with each other.

15. The thin film transistor array panel of claim 14, wherein at least one of the first contact hole and the second contact hole has a rounded side.

16. The thin film transistor array panel of claim 15, wherein an exposed portion of the semiconductor layer between the source electrode and the drain electrode and contacting the passivation layer has a shape of a straight line.

17. A thin film transistor array panel comprising:
a substrate;
a gate electrode on the substrate;
a semiconductor layer on the substrate;
a gate insulating layer between the gate electrode and the semiconductor layer;
an etching stopper on the semiconductor layer;
a source electrode, and a drain electrode facing the source electrode on the substrate; and
a passivation layer covering the source electrode, the drain electrode, and the etching stopper,
wherein the etching stopper comprises an etching prevention portion between the source electrode and the drain electrode, covers a portion of the semiconductor layer, and has a first contact hole and a second contact hole exposing another portion of the semiconductor layer, and having complementary shapes such that a combination of the first and second contact holes along a direction in which the first and second contact holes face each other has a substantially quadrangular shape in a plan view,
wherein the first contact hole has a first planar pattern and the second contact hole has a second planar pattern, and
a side of the first planar pattern and a side of the second planar pattern face each other, and one of the sides of the first planar pattern and the second planar pattern has a recess portion and the other of the sides has a protrusion portion,
wherein the source electrode contacts the semiconductor layer through the first contact hole,
wherein the drain electrode contacts the semiconductor layer through the second contact hole,
wherein a shortest distance A between an upper side and a lower side of an overlap area where the etching prevention portion and the semiconductor layer overlap one another is represented by a straight line in a plan view, and
wherein a width of a channel portion of the semiconductor layer is greater than the shortest distance A.

18. The thin film transistor array panel of claim 17, wherein the side of the first planar pattern or the side of the second planar pattern has two or more recess portions or two or more protrusion portions.

* * * * *